(12) United States Patent
Kume

(10) Patent No.: US 10,720,366 B2
(45) Date of Patent: Jul. 21, 2020

(54) METHOD FOR MANUFACTURING RESISTIVITY STANDARD SAMPLE AND METHOD FOR MEASURING RESISTIVITY OF EPITAXIAL WAFER

(71) Applicant: SHIN-ETSU HANDOTAI CO., LTD., Tokyo (JP)

(72) Inventor: Fumitaka Kume, Takasaki (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 16/324,435

(22) PCT Filed: Jul. 28, 2017

(86) PCT No.: PCT/JP2017/027384
§ 371 (c)(1),
(2) Date: Feb. 8, 2019

(87) PCT Pub. No.: WO2018/037831
PCT Pub. Date: Mar. 1, 2018

(65) Prior Publication Data
US 2019/0326184 A1    Oct. 24, 2019

(30) Foreign Application Priority Data

Aug. 25, 2016 (JP) .................. 2016-164749

(51) Int. Cl.
*H01L 21/02*    (2006.01)
*H01L 21/66*    (2006.01)
(Continued)

(52) U.S. Cl.
CPC ......... *H01L 22/12* (2013.01); *G01N 21/3563* (2013.01); *H01L 21/02532* (2013.01);
(Continued)

(58) Field of Classification Search
None
See application file for complete search history.

(56) References Cited

U.S. PATENT DOCUMENTS

| 9,076,827 B2* | 7/2015 | Bour ............... G01K 11/20 |
| 2016/0035583 A1* | 2/2016 | Torigoe ............ C30B 25/10 |
| | | 438/471 |
| 2017/0011918 A1* | 1/2017 | Torigoe ............ C23C 16/24 |

FOREIGN PATENT DOCUMENTS

| JP | H07-037953 A | 2/1995 |
| JP | 2003-065724 A | 3/2003 |

(Continued)

OTHER PUBLICATIONS

Sep. 19, 2017 International Search Report issued in International Patent Application No. PCT/JP2017/027384.

*Primary Examiner* — Bradley Smith
(74) *Attorney, Agent, or Firm* — Oliff PLC

(57) ABSTRACT

A method for manufacturing a resistivity standard sample include the steps, preparing a first-conductivity-type silicon single crystal substrate, measuring a thickness of the silicon single crystal substrate by using a thickness measuring instrument having traceability to the national standard, growing a second-conductivity-type silicon epitaxial layer on the silicon single crystal substrate to fabricate an epitaxial wafer having a p-n junction, measuring a thickness of the epitaxial wafer by using the thickness measuring instrument having the traceability to the national standard, obtaining a thickness of the silicon epitaxial layer from the thicknesses of the epitaxial wafer and the silicon single crystal substrate, and measuring a resistivity of the silicon epitaxial layer by using a resistivity measuring instrument having traceability to a resistivity standard reference material. Consequently, the method for manufacturing which enables manufacturing a resistivity standard sample having the traceability to the (Continued)

resistivity standard reference material of, e.g., NIST is provided.

10 Claims, 2 Drawing Sheets

(51) Int. Cl.
  *G01N 21/3563* (2014.01)
  *G01N 21/35* (2014.01)
(52) U.S. Cl.
  CPC .......... *H01L 21/02617* (2013.01); *G01N 2021/3568* (2013.01); *G01N 2021/3595* (2013.01)

(56) References Cited

FOREIGN PATENT DOCUMENTS

| | | |
|---|---|---|
| JP | 2010-028011 A | 2/2010 |
| JP | 2014-116488 A | 6/2014 |

\* cited by examiner

[FIG.1]
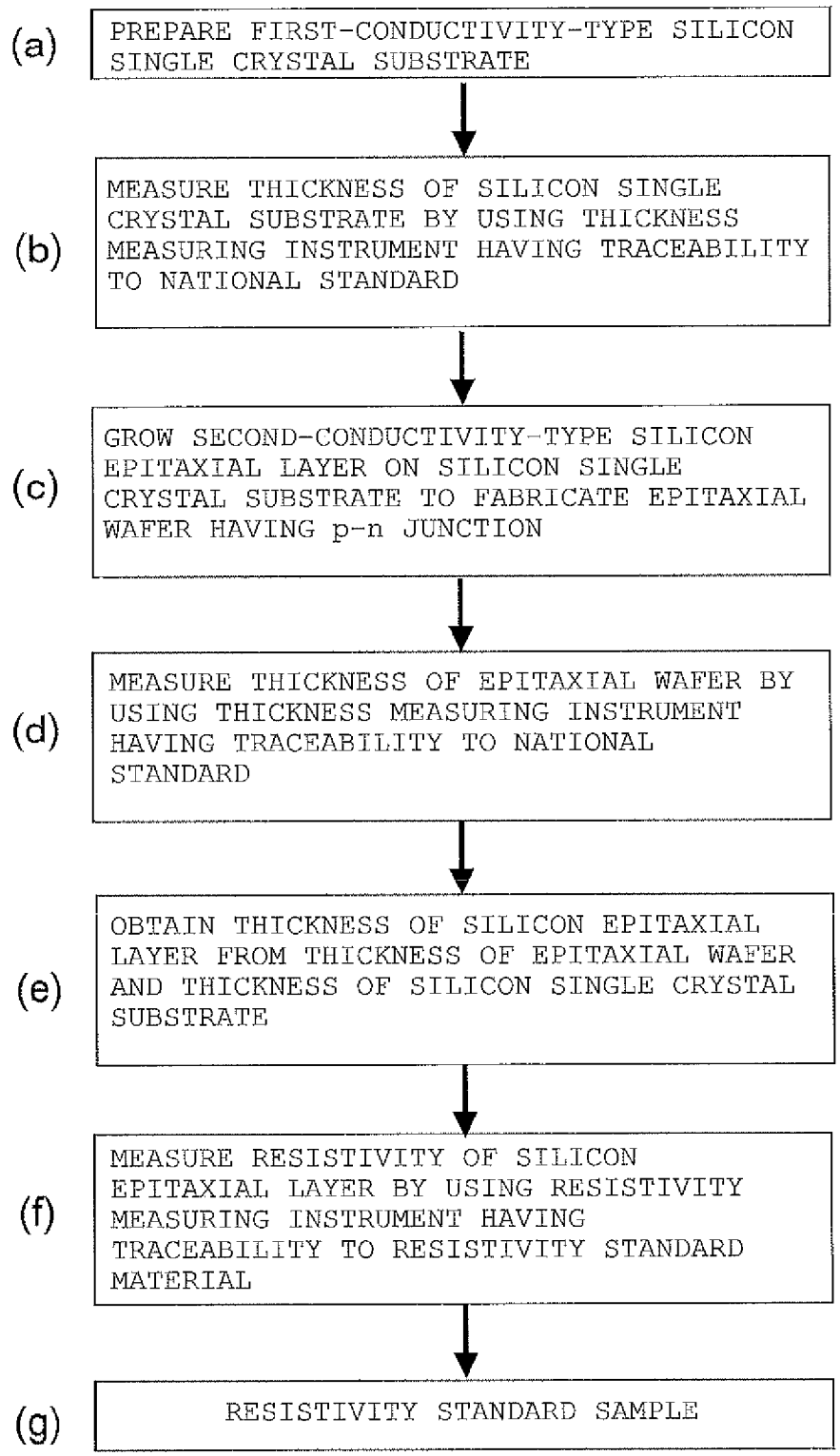

[FIG.2]
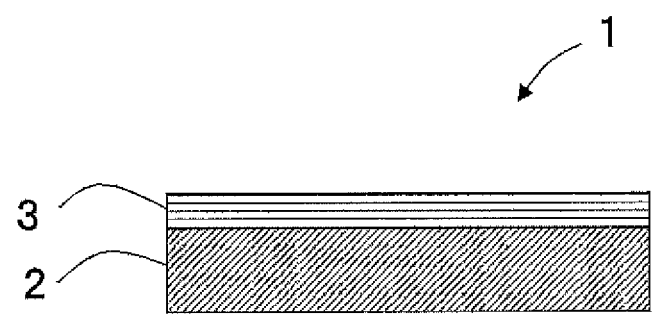

METHOD FOR MANUFACTURING RESISTIVITY STANDARD SAMPLE AND METHOD FOR MEASURING RESISTIVITY OF EPITAXIAL WAFER

TECHNICAL FIELD

The present invention relates to a method for manufacturing a resistivity standard sample and a method for measuring a resistivity of an epitaxial wafer.

BACKGROUND ART

As a method for measuring a resistivity of a silicon epitaxial layer, a direct-current four-probe method and a C-V (capacitance-voltage) method have been conventionally known.

According to the direct-current four-probe method, a tungsten carbide which is a cemented carbide is used for probes, four probes are vertically pressed against and brought into contact with a sample surface, a current I (A) is flowed through the outer probes, and a potential difference V (V) between the two inner probes is measured. A resistivity ρ of a wafer is calculated by using Expression (1).

$$\rho(\Omega \cdot cm) = 2\pi S V / I \cdot F_w \cdot F_r \quad (1,$$

where S is a probe interval (e.g., 1 mm), $F_w$ is a correction term based on a thickness of a wafer, and $F_r$ is a correction term based on a diameter and a measurement position of the wafer.

A resistivity measuring instrument used in the direct-current four-probe method can perform calibration with the use of a standard wafer having traceability to resistivity standard reference materials (SRM) on seven levels, i.e., SRM 2541 (0.01 Ω·cm) to SRM 2547 (200 Ω·cm) provided by NIST (National Institute of Standards and Technology).

Each of SRM 2541 to SRM 2543 is obtained by lapping a boron-doped p-type CZ crystal into a wafer shape, and each of SRM 2544 to SRM 2547 is obtained by lapping a neutron-irradiated n-type FZ crystal into a wafer shape. The above-described standard wafer is also a bulk wafer obtained by lapping the CZ crystal or the FZ crystal into a wafer shape. The SRM selected to interpose a resistivity of the standard wafer is measured by a measuring instrument adopting the direct-current four-probe method to calibrate the measuring device, and the standard wafer is measured by the calibrated measuring instrument, thereby giving a value to the resistivity as a secondary standard value.

On the other hand, according to the C-V method, a Schottky junction is formed on a surface of a silicon single crystal wafer by using, e.g., a mercury electrode, and a depletion layer is spread in the silicon single crystal wafer by applying a reverse bias voltage to the electrode while continuously changing it, whereby a capacity is changed. Further, dopant concentration at a desired depth is calculated from a relationship between this reverse bias voltage and the capacity, and the dopant concentration is converted into a resistivity by using a conversion expression such as ASTM STANDARDS F723 or the like.

At present, there is no international standard or national standard (national measurement standard) rules or the like concerning resistivities obtained by the C-V method, and resistivity correlations are individually confirmed among trading companies as required. However, it has been already known that resistivities obtained by the C-V method and the direct-current four-probe method substantially have a correlation and, for example, Patent Literature 1 has a description that a resistivity provided by the C-V method and a resistivity provided by the four-probe method after an HF treatment substantially coincide with each other. Furthermore, Patent Literature 1 also has a description that a resistivity of an epitaxial layer in an epitaxial wafer can be calculated from a constant, sheet resistance of the epitaxial layer, and a film thickness of the epitaxial layer.

CITATION LIST

Patent Literatures

Patent Document 1: JPH7-37953A
Patent Document 2: JP2003-65724A

SUMMARY OF INVENTION

Technical Problem

When the reverse bias voltage is applied to the silicon epitaxial layer by using the measuring instrument adopting the C-V method, the depletion layer spreads in the depth direction in accordance with the resistivity. A spread width of the depletion layer is narrow when the resistivity is low, and the same is wide when the resistivity is high. For example, in case of applying the reverse bias voltage of 1 V as an initial application voltage to an n-type silicon epitaxial layer, a width of a depletion layer to be formed is 0.45 μm when a resistivity is 0.5 Ω·cm, 1.5 μm when the resistivity is 5 Ω·cm, or 5 μm when the resistivity is 50 Ω·cm.

On the other hand, a secondary standard wafer for the direct-current four-probe method is a bulk wafer which has been subjected to lapping or the like and has a thickness of approximately 400 μm to 800 μm, and it has a resistivity fluctuation in a thickness direction. Thus, a standard value of the direct-current four-probe method indicative of an average resistivity of the entire bulk does not necessarily coincide with a resistivity from a surface to a depth of approximately m. Moreover, when the resistivity fluctuates along the thickness direction in a C-V method measurement region from a secondary standard wafer surface to approximately 10 μm, a value of the resistivity changes depending on a measurement depth to be selected.

Consequently, when the direct-current four-probe method is correlated with the C-V method by using the secondary standard bulk wafer, a correlation equation largely fluctuates every time the secondary standard wafer is changed, and hence a standard value of the direct-current four-probe method cannot be correlated with a resistivity measurement value of the C-V method.

On the other hand, according to the method for measuring a resistivity of an n-type silicon epitaxial layer disclosed in Patent Literature 1, a resistivity provided by the C-V method substantially coincides with a resistivity provided by the four-probe method after the HF treatment. It can be considered that the resistivities coincide with each other since a sample used in comparison in resistivity between the C-V method and the four-probe method is a silicon epitaxial layer rather than a bulk wafer. Since MFC (Mass Flow Controller) is used for the silicon epitaxial layer at the time of vapor phase epitaxy, the resistivity in the thickness direction can be easily managed constant.

However, in Patent Literature 1, since a thickness of the silicon epitaxial layer is measured by using an FT-IR (Fourier Transform Infrared Spectroscopy) method or an SR (Spreading Resistance) method having no traceability to the national standard, a resistivity value of the direct-current four-probe method calculated with the use of the thickness cannot have the traceability to the national standard.

In view of the above-described problem, it is an object of the present invention to provide a method for manufacturing a resistivity standard sample which enables manufacturing a resistivity sample having traceability to a resistivity standard reference material of, e.g., NIST. Additionally, it is another object of the present invention to provide a method for measuring a resistivity of an epitaxial wafer which enables measuring an epitaxial layer resistivity of an epitaxial wafer as a measurement target with the use of a C-V method measuring device having traceability to a resistance standard reference material of, e.g., NIST by calibrating the C-V method measuring device using a manufactured resistivity standard sample.

Solution to Problem

To achieve the object, the present invention provides a method for manufacturing a resistivity standard sample including:

a step of preparing a first-conductivity-type silicon single crystal substrate;

a substrate thickness measuring step of measuring a thickness of the first-conductivity-type silicon single crystal substrate by using a thickness measuring instrument calibrated by a standard block gauge having traceability to the national standard;

a vapor phase growth step of growing a second-conductivity-type silicon epitaxial layer having a second conductivity type which is a conductivity type opposite to the first conductivity type on the first-conductivity-type silicon single crystal substrate to fabricate an epitaxial wafer having a p-n junction;

an epitaxial wafer thickness measuring step of measuring a thickness of the epitaxial wafer by using the thickness measuring instrument;

a step of obtaining a thickness of the second-conductivity-type silicon epitaxial layer from the thickness of the epitaxial wafer and the thickness of the first-conductivity-type silicon single crystal substrate; and a resistivity measuring step of measuring a resistivity of the silicon epitaxial layer by using a resistivity measuring instrument having traceability to a resistivity standard reference material.

In this manner, obtaining the resistivity of the silicon epitaxial layer of the epitaxial wafer with the use of the thickness measuring instrument having the traceability to the national standard and the resistivity measuring instrument having the traceability to the resistivity standard reference material enables assuredly manufacturing the resistivity standard sample having the traceability to the resistivity standard reference material.

At this time, it is preferable for the resistivity standard reference material to be at least one of NIST standard reference materials SRM 2541 to SRM 2547.

The NIST standard reference materials are national standard reference materials in the United States and have the extremely high reliability, and hence the reliability of the manufactured resistivity standard sample can be further raised.

At this time, it is preferable to set impurity concentration in the first-conductivity-type silicon single crystal substrate be less than $1 \times 10^{18}$ atoms/cm$^3$.

With such impurity concentration in the silicon single crystal substrate, an influence of outward diffusion of impurities in the silicon single crystal substrate to the silicon epitaxial layer and auto-doping can be substantially eliminated, and the resistivity standard sample with a higher accuracy can be manufactured.

At this time, it is preferable to set the thickness of the second-conductivity-type silicon epitaxial layer to 100 μm or more and 200 μm or less.

When the thickness of the silicon epitaxial layer is 100 μm or more, an influence of an increase in resistivity near the p-n junction on the resistivity of the silicon epitaxial layer becomes very small, and the resistivity standard sample with a higher accuracy can be provided. Further, since an epitaxial wafer having a silicon epitaxial layer with a thickness exceeding 200 μm does not usually exist, when the silicon epitaxial layer has a thickness of up to 200 μm, the practically sufficient resistivity standard sample can be provided.

Furthermore, a C-V method measuring device which is a front surface electrode can be calibrated by using a resistivity standard sample fabricated by the method for manufacturing a resistivity standard sample as a secondary standard sample, and an epitaxial layer resistivity of an epitaxial wafer as a measurement target can be measured by the calibrated C-V method measuring device which is the front surface electrode.

As described above, when the resistivity of the epitaxial layer in the epitaxial wafer as a measurement target is measured by the C-V method measuring device which is the front surface electrode calibrated with the secondary standard sample, the measured resistivity of the epitaxial layer can have the traceability to the resistivity standard reference material of, e.g., NIST.

Moreover, an epitaxial layer resistivity of a P/P-type or N/N-type silicon epitaxial wafer can be measured to provide a tertiary standard sample by using a C-V method measuring device which is a front surface electrode calibrated with a resistivity standard sample fabricated by the method for manufacturing a resistivity standard sample as a secondary standard sample, a C-V method measuring device which is a back surface electrode can be calibrated by using the tertiary standard sample, and an epitaxial layer resistivity of an epitaxial wafer as a measurement target can be measured by the calibrated C-V method measuring device which is the back surface electrode.

In this manner, when the resistivity of the epitaxial layer in the epitaxial wafer is measured by the C-V method measuring device which is the back surface electrode calibrated with the tertiary standard sample, the measured resistivity of the epitaxial layer can have the traceability to the resistivity standard reference material of, e.g., NIST.

Advantageous Effects of Invention

According to the method for manufacturing a resistivity standard sample of the present invention, it is possible to assuredly manufacture a resistivity standard sample including an epitaxial layer whose resistivity has traceability to a resistivity standard reference material of, e.g., NIST. Additionally, according to the method for measuring a resistivity of an epitaxial wafer of the present invention, when a C-V method measuring device which is a front surface electrode is calibrated with the use of a resistivity standard sample, the epitaxial layer resistivity measurement having traceability to a resistivity standard reference material of, e.g., NIST can be performed to an epitaxial wafer as a measurement target. Further, according to another method for measuring a resistivity of an epitaxial wafer of the present invention, when a C-V method measuring device which is a back surface electrode is calibrated with the use of a standard sample having no p-n junction, the epitaxial layer resistivity measurement having traceability to a resistivity standard reference material of, e.g., NIST can be carried out to an epitaxial wafer as a measurement target.

BRIEF DESCRIPTION OF DRAWINGS

FIG. 1 is a schematic process drawing showing an example of a method for manufacturing a resistivity standard sample according to the present invention; and FIG. 2 is a schematic view showing a structure of a resistivity standard sample according to the present invention.

DESCRIPTION OF EMBODIMENT

Although the present invention will now be described hereinafter in detail with reference to the drawings, the present invention is not restricted thereto.

FIG. 1 is a schematic process diagram showing an example of a method for manufacturing a resistivity standard sample according to the present invention. The method for manufacturing a resistivity standard sample according to the present invention has a step (a step (a)) of preparing a first-conductivity-type silicon single crystal substrate, a substrate thickness measuring step (a step (b)) of measuring a thickness of the silicon single crystal substrate by using a thickness measuring instrument having traceability to the national standard, a vapor phase growth step (a step (c)) of growing a second-conductivity-type silicon epitaxial layer on the silicon single crystal substrate to fabricate an epitaxial wafer having a p-n junction, an epitaxial wafer thickness measuring step (a step (d)) of measuring a thickness of the epitaxial wafer by using the thickness measuring instrument having the traceability to the national standard, a step (a step (e)) of obtaining a thickness of the silicon epitaxial layer from the thickness of the epitaxial wafer and the thickness of the silicon single crystal substrate, and a resistivity measuring step (a step (f)) of measuring a resistivity of the silicon epitaxial layer by using a resistivity measuring instrument having traceability to a resistivity standard reference material. The steps are carried out to form the second-conductivity-type silicon epitaxial layer having a second conductivity type which is a conductivity type opposite to the first conductivity type on the first-conductivity-type silicon single crystal substrate. It is possible to manufacture a resistivity standard sample (the epitaxial wafer) having the traceability to the resistivity standard reference material of, e.g., NIST ((g) in FIG. 1).

A description will now be given on the resistivity standard sample according to the present invention. FIG. 2 is a schematic view showing a structure of the resistivity standard sample 1 according to the present invention. The resistivity standard sample 1 according to the present invention has a first-conductivity-type silicon single crystal substrate 2 (which may be simply referred to as a substrate 2 hereinafter) and a second-conductivity-type silicon epitaxial layer 3. The substrate 2 may be a p-type or an n-type, but the first conductivity type and the second conductivity type are conductivity types which are opposite to each other.

Each of the above steps will now be described hereinafter in detail. First, the substrate 2 having the first conductivity type is prepared (the step (a) in FIG. 1). Further, a thickness of the substrate 2 is measured by a thickness measuring instrument such as a dial gauge calibrated with the use of a standard block gauge with traceability which meets the provisions of Japanese Industrial Standards JISB 7506 and has a calibration certificate of JCSS (Japan Calibration Service System) issued thereto (the step (b) in FIG. 1, the substrate thickness measuring step). In this measurement, when the thickness measuring instrument comes into contact with the substrate 2, it is desirable to clean the substrate 2 before the subsequent step, i.e., the vapor phase growth step (the step (c) in FIG. 1).

Subsequently, the second-conductivity-type silicon epitaxial layer 3 (which may be simply referred to as an epi-layer 3 hereinafter) is grown on the first-conductivity-type silicon single crystal substrate 2 to fabricate an epitaxial wafer 1 having a p-n junction (the step (c) in FIG. 1, the vapor phase growth step). The p-type substrate 2 is used when the epi-layer 3 is the n-type, or the n-type substrate 2 is used when the epi-layer 3 is the p-type, and the p-n junction is formed between the substrate 2 and the epi-layer 3.

The p-n junction is formed between the substrate 2 and the epi-layer 3 for the purpose of measuring a resistivity of the epi-layer 3 alone by the direct-current four-probe method. When the resistivity is measured on a epitaxial layer surface of the epitaxial wafer (a P/P-type or an N/N-type) having no p-n junction formed thereto by using the direct-current four-probe method, an average resistivity of the epitaxial layer and the silicon single crystal substrate is obtained, but the resistivity of the epitaxial layer alone is not obtained. It is to be noted that the first P in the P/P-type represents the p-type epitaxial layer, and the latter P represents the p-type silicon single crystal substrate. Likewise, the N/N-type represents the n-type epitaxial layer and the n-type silicon single crystal substrate.

Then, a thickness of the epitaxial wafer 1 is measured by a thickness measuring instrument such as a dial gauge calibrated with the use of a standard block gauge having the traceability to the national standard (the step (d) in FIG. 1, the epitaxial wafer thickness measuring step). At this time, a thickness of the epi-layer 3 is obtained by subtracting the thickness of the substrate 2 from the thickness of the epitaxial wafer 1 (the step (e) in FIG. 1). According to this method, both the thickness of the epitaxial wafer 1 and the thickness of the substrate 2 have the traceability to the national standard, and hence the thickness of the epi-layer 3 can likewise have the traceability to the national standard.

Further, a resistivity of the epi-layer 3 is measured with the use of a resistivity measuring instrument based on the direct-current four-probe method having the traceability to a resistivity standard reference material (the step (f) in FIG. 1, the resistivity measuring step). At this step, first, the resistivity measuring instrument based on the direct-current four-probe method is calibrated by using the resistivity standard reference materials on two levels which interpose the resistivity of the epi-layer 3 therebetween. Then, the resistivity of the epi-layer 3 in the epitaxial wafer 1 is measured by using the same resistivity measuring instrument. As the thickness of the epi-layer 3 required for the calculation of the resistivity, a physical thickness with the traceability obtained by subtracting the thickness of the substrate 2 from the thickness of the epitaxial wafer 1 is used. A value of the thus obtained resistivity is given as a secondary standard value of the epi-layer 3, and the epitaxial wafer having the p-n junction is determined as a resistivity standard sample.

Since the value of the resistivity of the epi-layer 3 in the thus manufactured resistivity standard sample 1 is given by using the physical thickness with the traceability and the measurement value provided by the direct-current four-probe method with the traceability, it can be used for calibration of any other resistivity measuring device as a secondary standard value of the direct-current four-probe method.

In the method for manufacturing a resistivity standard sample according to the present invention, it is preferable for the resistivity standard reference material to be at least one of SRM 2541 to SRM 2547 which are NIST standard reference materials. The NIST standard reference materials are the national standard reference materials in the United States and have the extremely high reliability, and hence the reliability of the manufactured resistivity standard sample can be raised.

Furthermore, in the method for manufacturing a resistivity standard sample according to the present invention, it is preferable to set impurity concentration in the first-conductivity-type silicon single crystal substrate 2 to be less than $1\times10^{18}$ atoms/cm$^3$. Since outward diffusion from the substrate 2 to the epi-layer 3 and auto-doping become considerable as the impurity concentration in the substrate 2 increases, in case of measuring the resistivity of the epi-layer 3 by the direct-current four-probe method, an influence of the impurities in the substrate 2 on the resistivity value of the epi-layer 3 becomes large. Thus, when the substrate 2 whose impurity concentration is less than $1\times10^{18}$ atoms/cm$^3$ is used to substantially eliminate the influence of the outward diffusion and the auto-doping of the impurities, the resistivity standard sample having a higher accuracy can be manufactured. Moreover, a lower limit of the impurity concentration in the first-conductivity-type silicon single crystal substrate 2 is not restricted in particular, and it can be a value higher than 0 atoms/cm$^3$.

When the impurity concentration in the substrate 2 is $1\times10^{18}$ atoms/cm$^3$ or more, as described in Patent Literature 2, the thickness of the epi-layer 3 formed in the epitaxial wafer 1 can be measured by using a Fourier transform infrared spectrometer (FT-IR). However, an epi-layer thickness measurement value of the FT-IR does not have the traceability to the national standard. Therefore, in the present invention, the FT-IR is not used for the measurement of the thickness of the epi-layer 3.

The thickness of the epi-layer 3 obtained by subtracting the thickness of the substrate 2 from the thickness of the epitaxial wafer 1 is the physical thickness of the actually grown epi-layer 3. On the other hand, a thickness measurement value of the epi-layer provided by the FT-IR is an optical thickness and corresponds to a thickness from a transition region having the impurity concentration of $1\times10^{18}$ atoms/cm$^3$ by which infrared light is reflected to the surface of the epi-layer 3. In other words, the optical thickness of the epi-layer measured by the FT-IR is thinner than the physical thickness by the thickness from the surface of the substrate 2 to the transmission region having the impurity concentration of $1\times10^{18}$ atoms/cm$^3$.

Consequently, when a resistivity is calculated by using the physical thickness of the epi-layer 3 which is obtained by subtracting the thickness of the substrate 2 from the thickness of the epitaxial wafer 1, its value becomes larger than that obtained by using the optical measurement value based on the FT-IR.

It is to be noted the thickness from the surface of the substrate 2 (an interface between the substrate 2 and the epi-layer 3) to the transition region having the impurity concentration of $1\times10^{18}$ atoms/cm$^3$ in the epi-layer 3 is usually 0.5 μm or less irrespective of the thickness of the epi-layer 3. Thus, a proportion of a difference between the physical thickness and the optical thickness in these thicknesses becomes smaller as the epi-layer 3 becomes thicker.

It is preferable to set the thickness of the second-conductivity-type silicon epitaxial layer to 100 μm or more and 200 μm or less. When the p-n junction is formed between the substrate 2 and the epi-layer 3, a resistivity near the p-n junction increases, a measurement value obtained by the direct-current four-probe method is affected by this increase. The influence becomes considerable as the epi-layer becomes thinner and the resistivity of the substrate 2 decreases. Thus, setting the thickness of the epi-layer 3 to be grown to 100 μm or more enables providing the standard sample having a higher accuracy. Furthermore, when the thickness of the epi-layer 3 is 100 μm, the proportion of the difference between the physical thickness and the optical thickness in these thicknesses becomes 0.5% or less, and the physical thickness becomes substantially equal to the optical thickness. Moreover, since there is no thickness of the epi-layer 3 exceeding 200 μm, when the thickness of the epi-layer 3 is up to 200 μm, the practically sufficient resistivity standard sample can be provided.

Additionally, the resistivity standard sample fabricated by the method for manufacturing a resistivity standard sample is used as a secondary standard sample to calibrate a C-V method measuring device which is a front surface electrode, and an epitaxial layer resistivity of the epitaxial wafer as a measurement target can be measured by the calibrated C-V method measuring device which is the front surface electrode. As described above, when the epitaxial layer resistivity of the epitaxial wafer as the measurement target is measured by the C-V method measuring device which is the front surface electrode calibrated with the use of secondary standard sample, the measured epitaxial layer resistivity can have the traceability to a resistivity standard reference material of, e.g., NIST.

Here, since the so-called C-V method measuring device which is the front surface electrode having both an electrode to which a voltage is applied and an earth electrode formed on the epi-layer 3 can perform the measurement without using the p-n junction, the resistivity standard sample having the p-n junction can be used for the calibration as a secondary standard sample for the C-V method measuring device which is the front surface electrode. Almost all C-V method measuring devices using respective mercury electrodes are the C-V method measuring devices which are the front surface electrodes.

Further, the C-V method measuring device which is the front surface electrode calibrated with the use of the resistivity standard sample fabricated by the method for manufacturing a resistivity standard sample as a secondary standard sample is used, an epitaxial layer resistivity of a P/P-type or N/N-type silicon epitaxial wafer is measured to provide a tertiary standard sample, a C-V method measuring device which is a back surface electrode is calibrated with the use of the tertiary standard sample, and an epitaxial layer resistivity of an epitaxial wafer as a measurement target can be measured by the calibrated C-V method measuring device which is the back surface electrode. In this manner, when the epitaxial layer resistivity of the epitaxial wafer is measured by the C-V method measuring device which is the back surface electrode calibrated with the tertiary standard sample, the measured epitaxial layer resistivity can have the traceability to a resistivity standard reference material of, e.g., NIST. As to the tertiary standard sample used for calibrating the C-V method measuring device which is the back surface electrode, a value of its resistivity is given by using the C-V method measuring device which is the front surface electrode rather than the direct-current four-probe method, and hence substrate dopant concentration may be higher or lower than $1\times10^{10}$ atoms/cm$^3$.

Here, the resistivity of the epi-layer 3 of the epitaxial wafer 1 having the p-n junction cannot be measured by the so-called C-V method measuring device which is the back surface electrode having the electrode to which a voltage is applied formed on the epi-layer 3 and the earth electrode formed on the substrate 2 side.

However, when the C-V method measuring device which is the front surface electrode calibrated with the resistivity standard sample having the p-n junction as the secondary standard is used to measure the epitaxial layer resistivity of the P/P-type or N/N-type silicon epitaxial wafer having no p-n junction and the tertiary standard sample is thereby provided, its resistivity value has the traceability to the resistivity standard material of, e.g., NIST. Thus, when the silicon epitaxial wafer having no p-n junction is used as the tertiary standard sample to calibrate the C-V method measuring device which is the back surface electrode, the C-V method measuring device which is the back surface electrode can likewise assure the traceability.

EXAMPLES

The present invention will now be more specifically described hereinafter with reference to examples and a comparative example, but the present invention is not restricted thereto.

Example 1

A phosphorous-doped n-type silicon single crystal substrate 2 having a resistivity of 10 Ω·cm (dopant concentration: $4.45\times10^{14}$ atoms/cm$^3$) was prepared, and a central portion of this substrate was measured by a dial gauge calibrated with the use of a standard block gauge having the traceability to the national standard, which resulted in a thickness of 625 nm.

The n-type silicon single crystal substrate 2 was cleaned by using SC1 and SC2, then a boron-doped p-type silicon epitaxial layer 3 was vapor-grown on the n-type silicon single crystal substrate 2, and a thickness of the epitaxial wafer 1 was measured by the dial gauge having the traceability to the national standard, which resulted in a thickness of 725 µm. Thus, a thickness of the vapor-grown p-type silicon epitaxial layer 3 was 100 µm.

Subsequently, a central portion of the silicon epitaxial layer 3 of the epitaxial wafer 1 having a p-n junction was measured by using a resistivity measuring instrument of the direct-current four-probe method with the traceability which had been calibrated using NIST standard reference materials SRM 2534 (1 Ω·cm) and SRM 2544 (10 Ω·cm), calculating a resistivity by multiplying the thickness 100 µm of the silicon epitaxial layer 3 resulted in 9 Ω·cm, and hence a resistivity standard sample (a secondary standard sample) with the traceability which has a standard value of 9 Ω·cm was provided. After measuring a resistivity of the silicon epitaxial layer 3 in this secondary standard sample by a mercury electrode C-V method measuring device which is a front surface electrode type, a result of 9 Ω·cm was obtained.

Example 2

First, resistivity standard samples on three levels which have respective p-n junctions and the traceability to NIST standard reference materials and in which respective p-type silicon epitaxial layers of 0.8 Ω·cm, 9 Ω·cm, and 50 Ω·cm are formed with a thickness of 110 µm were prepared as secondary standard samples. Further, these secondary standard samples were used to calibrate a C-V method measuring device which is a front surface electrode using a mercury electrode. Then, silicon epitaxial wafers on three levels which do not have respective p-n junctions, are P/P$^+$ type, and were manufactured in such a manner that respective silicon epitaxial layers could have resistivities of 1 Ω·cm, 10 Ω·cm, and 40 Ω·cm, and have the respective silicon epitaxial layers formed with a thickness of 10 µm were prepared. Subsequently, resistivities of the prepared silicon wafers were measured by the C-V method measuring device using the mercury electrode calibrated as described above to provide tertiary standard samples. Then, the tertiary standard samples on three levels having no p-n junction were used to calibrate a C-V method measuring device which is a back surface electrode. Furthermore, epitaxial layer resistivities of the epitaxial wafers as measurement targets were measured by using the C-V method measuring device which is the back surface electrode.

Comparative Example 1

A boron-doped p-type silicon epitaxial layer was vapor-grown with a thickness of 10 µm on a phosphorous-doped n-type silicon single crystal substrate having a resistivity of 0.0012 Ω·cm (dopant concentration: $6\times10^{19}$ atoms/cm$^3$), and a thickness of a central portion thereof was measured by the FT-IR, which resulted in 9.5 µm. Subsequently, after measuring a resistivity of a central portion of the p-type silicon epitaxial layer by using a resistivity measuring instrument adopting the direct-current four-probe method with the traceability to NIST standard reference materials, a result of 11 Ω·cm was obtained. A value provided by measuring this sample with the use of a mercury electrode C-V method measuring device which is a front surface electrode type was 10 Ω·cm.

As described above, in Example 1, it was possible to easily manufacture the resistivity standard sample having the traceability to the NIST standard reference materials, and the C-V method measuring device which is the front surface electrode could be calibrated with the use of this resistivity standard sample. Moreover, in Example 2, the epitaxial layer resistivity of each silicon epitaxial wafer having no p-n junction was measured by the calibrated C-V method measuring device which is the front surface electrode to provide the tertiary standard sample, and the C-V method measuring device which is the back surface electrode was calibrated with the use of this tertiary standard sample. Thus, the resistivity of the epitaxial layer of the epitaxial wafer as the measurement target measured by the calibrated C-V method measuring device which is the front surface electrode or the calibrated C-V method measuring device which is the back surface electrode has the traceability to the resistivity standard reference materials of, e.g., NIST. On the other hand, the sample in Comparative Example 1 does not have the traceability to the resistivity standard reference materials of, e.g., NIST, and the measured resistivity of the epitaxial layer does not have the traceability either.

It is to be noted that the present invention is not restricted to the foregoing embodiment. The foregoing embodiment is an illustrative example, and any example which has substantially the same structure and exerts the same functions and effects as the technical concept described in claims of the present invention is included in the technical scope of the present invention.

The invention claimed is:

1. A method for manufacturing a resistivity standard sample comprising:
- a step of preparing a first-conductivity-type silicon single crystal substrate;
- a substrate thickness measuring step of measuring a thickness of the first-conductivity-type silicon single crystal substrate by using a thickness measuring instrument calibrated by a standard block gauge having traceability to a national standard;
- a vapor phase growth step of growing a second-conductivity-type silicon epitaxial layer having a second conductivity type which is a conductivity type opposite to the first conductivity type on the first-conductivity-type silicon single crystal substrate to fabricate an epitaxial wafer having a p-n junction;
- an epitaxial wafer thickness measuring step of measuring a thickness of the epitaxial wafer by using the thickness measuring instrument;
- a step of obtaining a thickness of the second-conductivity-type silicon epitaxial layer from the thickness of the epitaxial wafer and the thickness of the first-conductivity-type silicon single crystal substrate; and
- a resistivity measuring step of measuring a resistivity of the silicon epitaxial layer by using a resistivity measuring instrument having traceability to a resistivity standard reference material,
- wherein the resistivity standard reference material is at least one of NIST standard reference materials SRM 2541 to SRM 2547.

2. The method for manufacturing a resistivity standard sample according to claim 1,
wherein impurity concentration in the first-conductivity-type silicon single crystal substrate is set to be less than $1 \times 10^{18}$ atoms/cm$^3$.

3. The method for manufacturing a resistivity standard sample according to claim 2,
wherein the thickness of the second-conductivity-type silicon epitaxial layer is set to 100 μm or more and 200 μm or less.

4. A method for measuring a resistivity of an epitaxial wafer comprising calibrating a C-V method measuring device which is a front surface electrode by using a resistivity standard sample fabricated by the method for manufacturing a resistivity standard sample according to claim 2 as a secondary standard sample, and measuring an epitaxial layer resistivity of an epitaxial wafer as a measurement target by the calibrated C-V method measuring device which is the front surface electrode.

5. A method for measuring a resistivity of an epitaxial wafer comprising measuring an epitaxial layer resistivity of a P/P-type or N/N-type silicon epitaxial wafer to provide a tertiary standard sample by using a C-V method measuring device which is a front surface electrode calibrated with a resistivity standard sample fabricated by the method for manufacturing a resistivity standard sample according to claim 2 as a secondary standard sample, calibrating a C-V method measuring device which is a back surface electrode by using the tertiary standard sample, and measuring an epitaxial layer resistivity of an epitaxial wafer as a measurement target by the calibrated C-V method measuring device which is the back surface electrode.

6. The method for manufacturing a resistivity standard sample according to claim 1,
wherein the thickness of the second-conductivity-type silicon epitaxial layer is set to 100 μm or more and 200 μm or less.

7. A method for measuring a resistivity of an epitaxial wafer comprising calibrating a C-V method measuring device which is a front surface electrode by using a resistivity standard sample fabricated by the method for manufacturing a resistivity standard sample according to claim 6 as a secondary standard sample, and measuring an epitaxial layer resistivity of an epitaxial wafer as a measurement target by the calibrated C-V method measuring device which is the front surface electrode.

8. A method for measuring a resistivity of an epitaxial wafer comprising measuring an epitaxial layer resistivity of a P/P-type or N/N-type silicon epitaxial wafer to provide a tertiary standard sample by using a C-V method measuring device which is a front surface electrode calibrated with a resistivity standard sample fabricated by the method for manufacturing a resistivity standard sample according to claim 6 as a secondary standard sample, calibrating a C-V method measuring device which is a back surface electrode by using the tertiary standard sample, and measuring an epitaxial layer resistivity of an epitaxial wafer as a measurement target by the calibrated C-V method measuring device which is the back surface electrode.

9. A method for measuring a resistivity of an epitaxial wafer comprising calibrating a C-V method measuring device which is a front surface electrode by using a resistivity standard sample fabricated by the method for manufacturing a resistivity standard sample according to claim 1 as a secondary standard sample, and measuring an epitaxial layer resistivity of an epitaxial wafer as a measurement target by the calibrated C-V method measuring device which is the front surface electrode.

10. A method for measuring a resistivity of an epitaxial wafer comprising measuring an epitaxial layer resistivity of a P/P-type or N/N-type silicon epitaxial wafer to provide a tertiary standard sample by using a C-V method measuring device which is a front surface electrode calibrated with a resistivity standard sample fabricated by the method for manufacturing a resistivity standard sample according to claim 1 as a secondary standard sample, calibrating a C-V method measuring device which is a back surface electrode by using the tertiary standard sample, and measuring an epitaxial layer resistivity of an epitaxial wafer as a measurement target by the calibrated C-V method measuring device which is the back surface electrode.

* * * * *